United States Patent [19]
Delcourt et al.

[11] Patent Number: 5,886,531
[45] Date of Patent: Mar. 23, 1999

[54] METHOD AND APPPARATUS FOR DETECTING AN ELECTRICAL CONNECTION DEFECT BETWEEN A CONNECTOR AND A SHIELD CABLE

[75] Inventors: Gilles Delcourt, Sainte-Foy-Les-Lyon; Jean Elles, 152, Boulevard Sebastien Pezetti, 8300 Toulon, both of France

[73] Assignee: Jean Elles, Toulon, France

[21] Appl. No.: 821,883

[22] Filed: Mar. 21, 1997

[30] Foreign Application Priority Data

Mar. 21, 1996 [FR] France .................................. 96 03763

[51] Int. Cl.⁶ .................................................. G01R 31/02
[52] U.S. Cl. .......................... 324/627; 324/519; 324/539; 324/543
[58] Field of Search .................................. 324/627, 528, 324/529, 530, 519, 539, 543

[56] References Cited

U.S. PATENT DOCUMENTS

| | | | |
|---|---|---|---|
| 2,446,195 | 8/1948 | Shivg | 324/627 |
| 3,492,588 | 1/1970 | Johnson | 324/627 |
| 3,839,672 | 10/1974 | Anderson | 324/627 |
| 4,425,542 | 1/1984 | Tsaliovich | 324/627 |
| 5,378,992 | 1/1995 | Murphy | 324/627 |
| 5,477,153 | 12/1995 | Murray | 324/627 |
| 5,600,252 | 2/1997 | Rossi | 324/627 |

FOREIGN PATENT DOCUMENTS

| | | |
|---|---|---|
| 0 454 578 | 10/1991 | European Pat. Off. . |
| 2170830 | 9/1973 | France . |

OTHER PUBLICATIONS

Vance: "Couphing to Shielded Cables"—Wiley—Jan. 1978—pp. 162–163.

Primary Examiner—Josie Ballato
Assistant Examiner—Jose M. Solis
Attorney, Agent, or Firm—Bacon & Thomas, PLLC

[57] ABSTRACT

The invention relates to a method of detecting a shielding defect of a shielded cable mounted in a building which defines between an instrument and the shielding of the cable, a first stray capacitance; the method steps are:

placing measurement apparatus in such a manner as to define a second stray capacitance between itself and the building;

injecting a high frequency signal into the shielding of the cable, by means of the measurement apparatus, the signal circulating back to the apparatus via the first and second stray capacitances; and measuring on the core of the cable, a signal that appears by radiation due to the injection of the high frequency signal, and representative of a defect in the shielding of the cable.

17 Claims, 2 Drawing Sheets

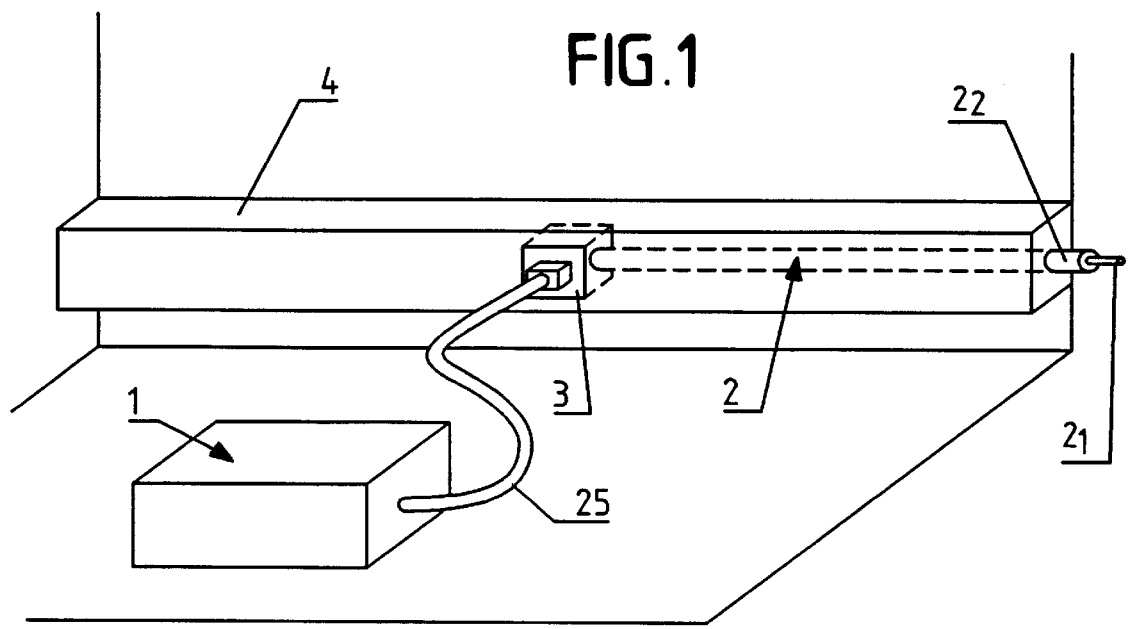
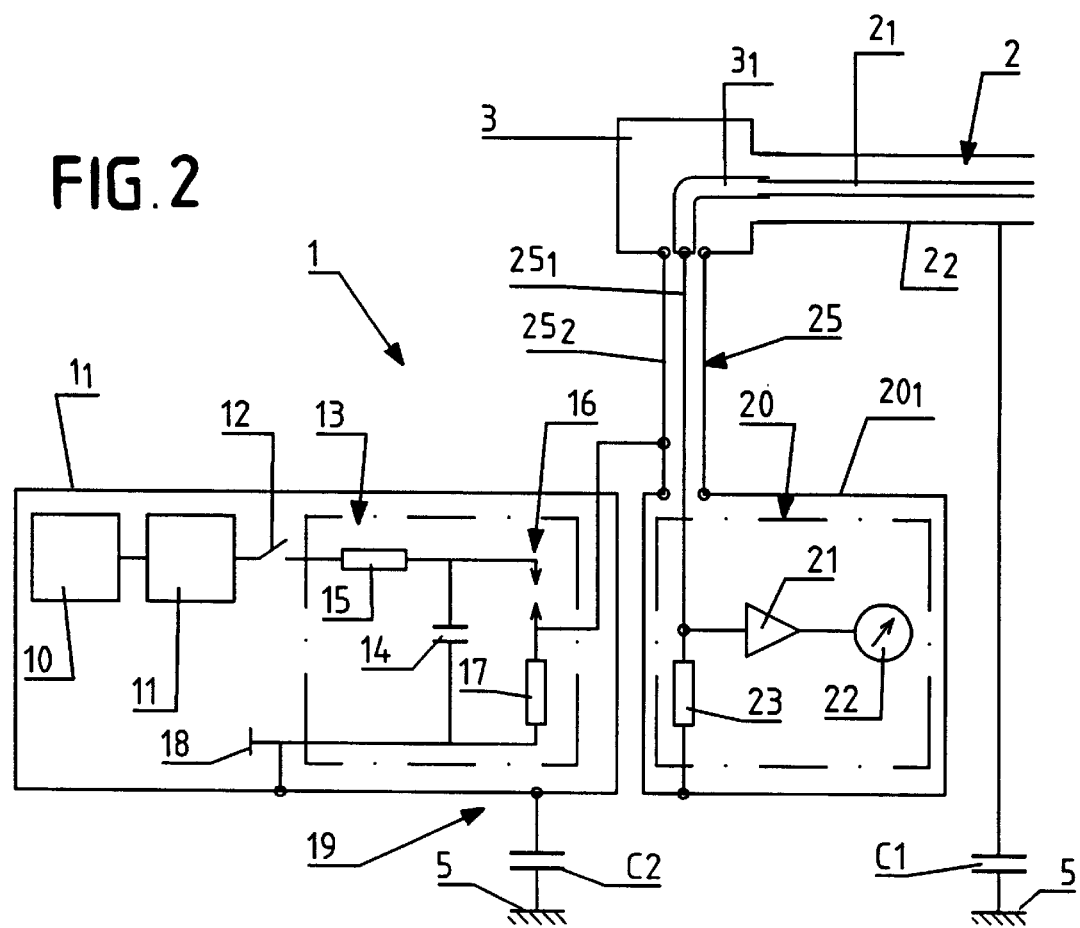

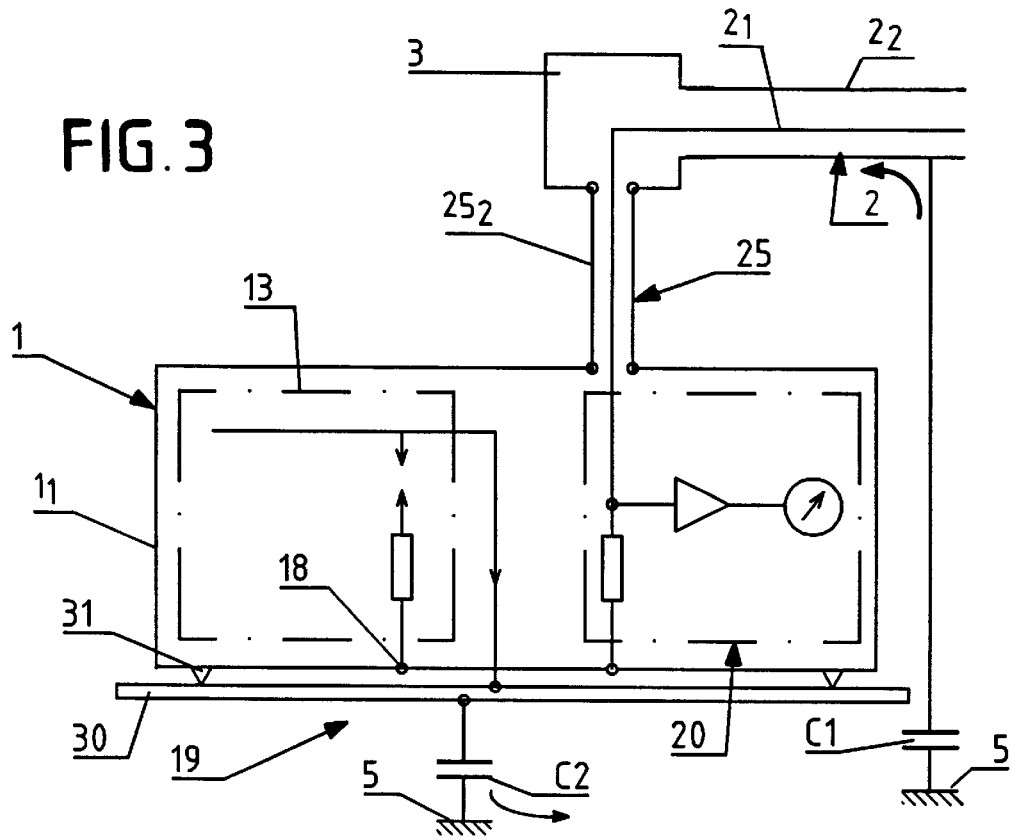
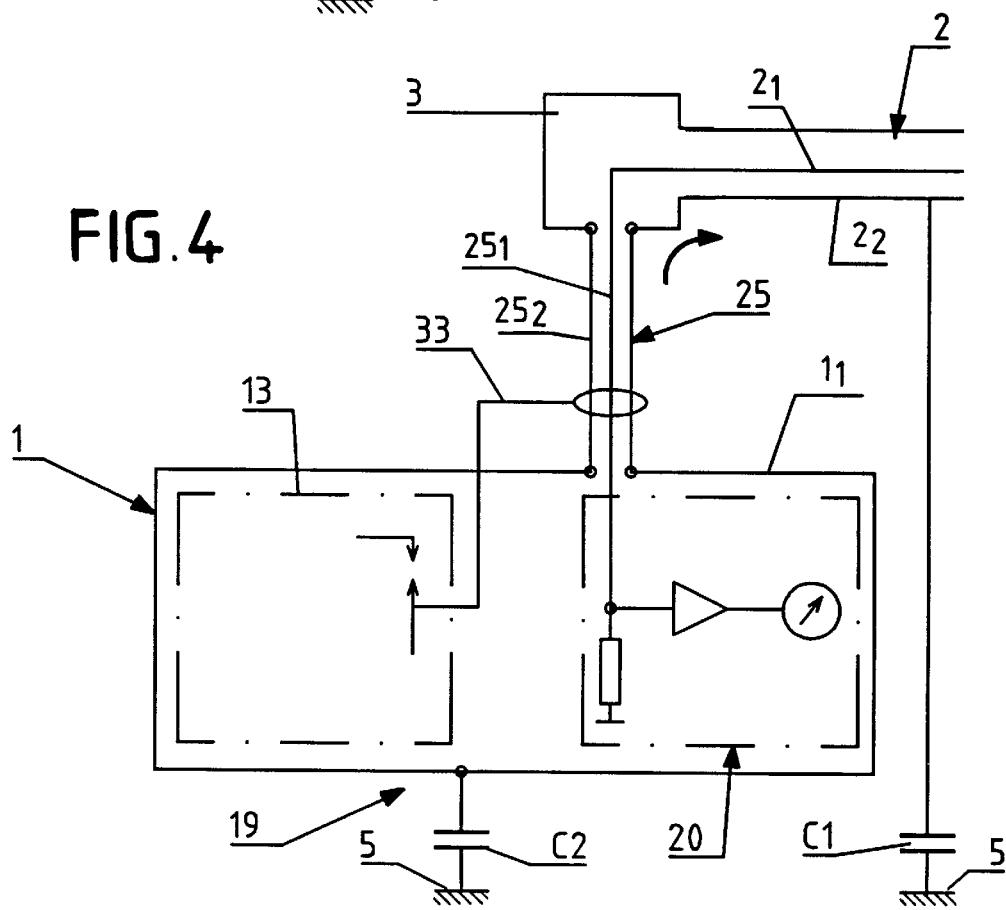

METHOD AND APPPARATUS FOR DETECTING AN ELECTRICAL CONNECTION DEFECT BETWEEN A CONNECTOR AND A SHIELD CABLE

FIELD OF THE INVENTION

The present invention relates to the technical field of means implemented for testing the quality of the shielding of an electric circuit in general.

More precisely, the invention relates to the technically means implemented for detecting a shielding defect of a circuit for transmitting data or information and constituted by shielded cables fitted with shielded connectors. More precisely, the invention relates to a detector for detecting a connection defect between the shielding of a cable and the shielding of a connector.

BACKGROUND OF THE INVENTION

In the state of the art, it is known to install shielded cables in buildings for the purpose of constituting a computer network for transmitting data or information. The transmission cables are generally mounted inducting and they are fitted at various points with shielded electrical connectors for connection to computer equipment.

It can sometimes happen that the shielding of such circuits is defective. Such a defect may be due to an "injury" suffered by the shielding, or to a poor electrical connection between the shielding of the electrical connector and the shielding of the cable. A shielding defect is liable to give rise to misfunction of the computer installation by making it more sensitive to interference. The computer installation can thus be disturbed by interference which may be constituted, for example, by fast transients in the electrical power supply, by electrostatic discharges, or by a radiated field or a magnetic field from lightning.

It thus appears to be relatively important to be able to test the transfer impedance or attenuation factor of a shielded cable installed in a building in order to ascertain the ability of the shielding to prevent the magnetic fields and electric fields having any effect. In practice, it is impossible to gain access to the shielding of the cable insofar as the cable is generally contained within ducting.

Document EP-A-0 454 578 which describes a method and apparatus for verifying the effectiveness of the electromagnetic shielding of a conductive cord, does not enable such an object to be achieved. The technique described recommends connecting one end of a conductor of the cord to the shielding of the associated connector via a resistor, while the other end of the conductor is connected to the shielding of the corresponding connector via another resistor. That technique therefore suffers from the drawback of requiring access to both ends of the conductor cord that is to be inspected.

Also known from French patent application FR 2 170 830, are a method and apparatus for inspecting the shielding of a shielded conductor forming a part of cabling constituted by a plurality of conductors. That document teaches isolating the shielding that is to be inspected from ground, and applying an alternating voltage thereto. All of the conductors and shielding of the cabling, other than the shielding under inspection, are grounded. A voltage is picked up from the conductor protected by the shielding, so as to assess the state of the shielding. That technique requires the use of cabling that is of a special type and it also makes it necessary to have access to the various conductors of the cabling.

OBJECTS AND SUMMARY OF THE INVENTION

The invention thus seeks to remedy the drawbacks of the prior techniques by proposing a method of measuring the transfer impedance or attenuation factor of the shielding of a cable installed on site without modifying the installation, in order to determine how effective the shielding is at preventing the active wires of the cable from being subjected to the action of interference.

The invention thus seeks to provide a method of detecting a shielding defect in a shielded cable mounted in a building and defining a first stray capacitance between the building and the shielding of the cable.

According to the invention, the method comprises the steps of:

placing a measurement apparatus in such a manner as to define a second stray capacitance between itself and the building;

injecting a high frequency signal into the shielding of the cable, by the measurement apparatus, the signal circulating back to the apparatus via the first and second stray capacitances; and measuring, a signal that appears on the core of the cable by radiation due to the injection of the high frequency signal, the signal being representative of a defect in the shielding of the cable.

The method of the invention thus makes it possible to measure the transfer impedance or attenuation factor of the shielding of a cable that is installed on a site, via an overall impedance constituted by connecting the coupling impedance between the measuring apparatus and the building in series with the coupling impedance between the cable and the same building.

Another object of the invention is to propose relatively simple apparatus for implementing the method of detecting a shielding defect of a shielded cable mounted in a building and defining a first stray capacitance between the building and the shielding of the cable.

According to the invention, the apparatus comprises:

a circuit for producing a high frequency signal for injection into the shielding of the cable;

means defining, relative to the apparatus, a second stray capacitance which, in association with the first stray capacitance, allows the signal to circulate between the high frequency producing circuit and the apparatus; and a detector circuit for connection to the core of the cable for the purpose of detecting a signal that appears on the core of the cable when the high frequency signal is injected, which signal is representative of a shielding defect of the cable.

BRIEF DESCRIPTION OF THE DRAWINGS

Various other characteristics appear from the following description made with reference to the accompanying drawings which show embodiments and implementations of the invention as non-limiting examples.

FIG. 1 is a general view showing detection apparatus of the invention for testing a shielded cable.

FIG. 2 is a functional block diagram showing an embodiment of apparatus of the invention.

FIGS. 3 and 4 show two other embodiments of apparatus of the invention.

MORE DETAILED DESCRIPTION

As can be seen more specifically in FIG. 1, the invention relates to apparatus 1 suitable for detecting the quality of the shielding of a shielded electric circuit formed, in the example shown, by a cable 2 that is shielded in the general sense, and fitted with a shielded electrical connector 3. In the example shown, the shielded cable 2 is mounted inside ducting 4 that forms a portion of a structure or a building 5. Such a shielded circuit forms a portion of a computer installation (not shown) and is designed to convey information or data. The shielded cable 2 can be of any type (coaxial, multipair, . . . ) and the shielding or "screening" can be implemented in various ways (braided copper, aluminum foil). In general, it can be considered that the cable 2 comprises a core $2_1$ and shielding $2_2$. The cable 2 is designed to be fitted with a connector 3 having shielding $3_2$ for connection to the shielding $2_2$ of the cable, and a relay conductor $3_1$ for being connected to the core $2_1$ of the cable.

It needs to be assumed that stray capacitance $C_1$ represented diagrammatically in FIG. 2 exists between the shielding $2_2$ of the cable 2 and the building 5.

The apparatus 1 of the invention is designed to detect a defect in the shielding of the circuit 2, 3 due to a defect in the shielding of the cable and/or a defective connection between the shielded portion $3_2$ of the connector and the shielding $2_2$ of the cable. Naturally, the apparatus 1 can be used whatever the type of connection between the cable and the connector.

The apparatus 1 of the invention includes a, preferably rechargeable, DC battery 10 connected to a chopper converter 11 that also serves to raise the battery voltage. The converter 11 is connected via a controlled switch 12 to a circuit 13 for producing a high frequency signal. By way of example, the high frequency producing circuit 13 is formed by a load capacitor 14 connected by a resistor 15 to the controlled switch 12 and to a system 16 for discharging the capacitor 14. For example, the system 16 may be of the gas type or of the semiconductor type. The discharge system 16 is connected by a resistor 17 to a reference potential 18 at which the capacitor 14 is also placed. The reference potential 18 preferably represents the zero voltage point of the apparatus to which the box or housing $1_1$ of the apparatus is advantageously connected.

The high frequency producing circuit 13 delivers, via the discharge system 16, a signal whose spectrum lies in the range 1 MHz to 300 MHz and preferably in the range 5 MHz to 15 MHz, at a voltage lying in the range 100 volts to 5000 volts, and preferably about 500 volts. In the example shown, the circuit 13 delivers a pulse signal at a repetition frequency of about 100th of a second. It should be considered that the circuit 13 may be suitable for delivering a signal of some other waveform, e.g. a sinewave signal having the frequency characteristics specified above. Similarly, the circuit 13 may operate at constant current or at constant voltage. The circuit 13 may be a voltage generator, but preferably it is a current generator.

The apparatus 1 of the invention also includes means 19 for returning the high frequency signal travelling via the shielding of the cable 2 back to the apparatus. The means 19 are adapted to define a second stray capacitance $C_2$, this time between the measurement apparatus 1 and the building 5, such that the high frequency signal can travel via the shielding of the cable 2 and the stray capacitances $C_1$ and $C_2$, thereby returning to the high frequency producing circuit 13. In the example shown in FIG. 2, the means 19 are adapted so that the stray capacitance $C_2$ is defined between the building 5 and the high frequency producing circuit 13. The circuit 13 is preferably placed at the same reference potential 18 as that at which the box or housing $1_1$ of the apparatus 1 is also placed.

The apparatus 1 of the invention also includes a circuit 20 for detecting the level of a signal which is representative of a defect in the shielding of the cables In the example shown, the detector circuit 20 is constituted, for example, by an amplifier 21 connected to a level indicator 22 such as a galvanometer, a digital display, or a bar graph. The input of the amplifier 21 is placed by means of a resistor 23 at a reference potential which may be the potential of a structure or a box $20_1$ for the circuit 20 forming a portion of the apparatus 1.

The apparatus 1 of the invention is used as follows.

The measurement apparatus 1 is placed and adapted to ensure that a stray capacitance $C_2$ appears between the building 5 and the high frequency producing circuit 13. By way of example, the apparatus 1 may be placed on the floor of the building 5 and the box $1_1$ of the apparatus is placed at the reference potential 18 to which the high frequency producing circuit 13 is also placed. In addition, the apparatus 1 is connected to the electrical connector 3 by means of a shielded connection cord 25. Thus, the high frequency producing system 13 is connected via the shielding $25_2$ of the cord to the shielding $3_2$ of the connector, while the input of the detector circuit 20 is connected via the core $25_1$ of the cord 25 to the hot point $3_1$ of the connector. Also, the shielding $25_2$ of the cord is connected to the box $20_1$ of the circuit 20.

The apparatus 1 is then controlled so that the high frequency producing circuit 13 causes a high frequency signal to be emitted via the shielding $3_2$ and $2_2$ of the connector 3 and of the cable 2, via the shielding of the cord 25. The signal is returned to the high frequency producing system 13 via the two stray capacitances $C_1$ and $C_2$ connected in series.

A defect in the shielding of the cable or in the connection between the shielding $3_2$ and the connector 3 and the shielding $2_2$ of the cable gives rise to the appearance, by radiation, of a signal on the core $2_1$ of the cable, and consequently to the signal entering the detector circuit 20. The level of the signal that appears on the core $2_1$, $3_1$ is representative of the defectiveness of the shielding. Thus, the more defective the shielding, the higher the level of the signal as picked up. The indicator 22 which may optionally include a memory serves to display the level of the signal as picked up in association with a scale of shielding defectiveness, thereby making it possible to know whether the shielding is defective.

The method of the invention thus makes it possible to detect the quality of shielding by measuring the transfer impedance or attenuation factor of the shielding. This measurement is performed via an overall stray capacitance which is constituted by connecting the coupling impedance between the high frequency producing circuit 13 and the building 5 in series with the coupling impedance between the cable 2 and the building 5. Detection performed in this way is reliable insofar as those two impedances vary little as a function of the height of the cable and of the equipment on which the cable and the apparatus are resting. In addition, the method is relatively easy to perform successfully since it only requires the measurement apparatus 1 to be connected to the electrical connector 3.

In the above example, the high frequency signal is injected via the high frequency producing circuit 13 onto the shielding of the cable via the shielding of the connection cord 25. This signal returns to the high frequency producing circuit by means of the stray capacitances $C_1$ and $C_2$.

FIG. 3 shows a variant embodiment of the invention in which the high frequency signal is injected via the stray capacitance $C_2$ to return to the high frequency producing circuit 13 via the stray capacitance $C_1$ and the cable 2. The means 19 for determining the second capacitance $C_2$ are provided by means of a metal plate 30 on which the apparatus 1 is mounted in electrically insulated manner by legs 31. The plate 30 is placed on a portion of the building 5 and is connected to the output of the high frequency producing circuit 13. The stray capacitance $C_2$ thus appears between the building 5 and the high frequency producing circuit 13 via the plate 30. The high frequency signal is thus injected into the shielding of the cable 2 via the plate 30 and the stray capacitances $C_2$ and $C_1$. The high frequency signal returns to the high frequency signal producing circuit 13 via the shielding $25_2$ of the connection cord 25, which is connected to the box $1_1$ of the apparatus 1, and which is preferably placed at the reference potential 18.

In the examples shown in FIGS. 2 and 3, it can be considered that the coupling between the apparatus 1 and the cable to be tested 2 is of a capacitive nature.

FIG. 4 shows another embodiment of the invention in which the coupling between the apparatus 1 and the cable to be tested 2 is of an inductive nature. The high frequency producing circuit 13 delivers its high frequency signal to the shielding $25_2$ of the connection cord 25 via a current clamp 33. To enable the signal to travel, the means 19 for determining the second stray capacitance are such that the stray capacitance $C_2$ is determined between the building 5 and shielding $25_2$ of the connection cord 25. In the example shown in FIG. 4, the shielding $25_2$ of the cord 25 is connected to the box $1_1$ of the apparatus which defines the capacitance $C_2$ relative to the building 5. It should be observed that the box $1_1$ which creates the stray capacitance $C_2$ may also be implemented by means of a shielded cable placed on the building 5 with the shielding thereof being connected to the shielding of the connection cord 25. Under such circumstances, the high frequency signal travels, as shown by the arrows, via the shielding $25_2$ and $2_2$ of the cord and of the cable and it returns via the stray capacitances $C_1$ and $C_2$ to the shielding $25_2$ via the box $1_1$ or via an attached cable.

The invention is not limited to the examples described and shown, and various modifications can be made thereto without going beyond the ambit of the invention.

I claim:

1. A method of detecting a shielding defect of a shielded cable mounted in a building which defines a first stray capacitance between itself and the shielding of the cable, the method comprising the steps of:

placing a measurement apparatus in such a manner as to define a second stray capacitance between itself and the building;

injecting a high frequency signal into the shielding of the cable by the measurement apparatus, the signal circulating back to the measurement apparatus via the first and second stray capacitances; and measuring a signal that appears on a core of the cable by radiation due to the injection of the high frequency signal, the signal being representative of a defect in the shielding of the cable.

2. A method according to claim 1, wherein the high frequency signal being injected into the shielding of the cable is in the range 1 MHz to 300 MHz.

3. A method according to claim 1, wherein the high frequency signal is injected in a capacitive manner.

4. A method according to claim 3, wherein the high frequency signal is injected via the stray capacitances with the signal returning to the apparatus via the shielding of the cable.

5. A method according to claim 1, wherein the high frequency signal is injected in an inductive manner.

6. A method according to claim 1, wherein the high frequency signal is injected in an inductive manner, and the second stray capacitance is defined between the measurement apparatus and the building via a structure of the apparatus.

7. A method according to claim 1, further comprising the step of: displaying a level of the measured signal relative to a scale of shielding defectiveness.

8. Apparatus for detecting a shielding defect of a shielded cable mounted in a building which defines a first stray capacitance between itself and the shielding of the cable, the apparatus comprising:

a circuit for producing a high frequency signal for injection into the shielding of the cable;

means defining a second stray capacitance relative to the apparatus which, in association with the first stray capacitance, allows the high frequency signal to circulate between the high frequency producing circuit and the apparatus; and a detector circuit for connection to a core of the cable for detecting a signal that appears on the core of the cable when the high frequency signal is injected, the signal being representative of a shielding defect of the cable.

9. Apparatus according to claim 8, wherein the means for defining the second stray capacitance comprises a structure of the apparatus placed relative to the building.

10. Apparatus according to claim 8, wherein the high frequency producing circuit is designed to deliver a high frequency signal to a plate which is adapted to co-operate with the building to define the second stray capacitance, and wherein the high frequency producing circuit is connected to the shielding of the cable to provide a return for the representative signal.

11. Apparatus according to claim 8, further comprising: a shielded cord for connection to the shielded cable.

12. Apparatus according to claim 8, wherein the detector circuit includes an amplifier stage connected to a system for indicating the level of the representative signal relative to a scale of shielding defectiveness.

13. Apparatus according to claim 8, wherein the high frequency signal produced by the high frequency producing circuit is in the range 1 MHz to 300 MHz.

14. A method according to claim 1, wherein the high frequency signal being injected into the shielding of the cable is in the range 5 MHz to 15 MHz.

15. A method according to claim 1, wherein the high frequency signal is injected in an inductive manner, and the second stray capacitance is defined between the measurement apparatus and the building via a cable.

16. Apparatus according to claim 8, wherein the means for defining the second stray capacitance comprises a cable placed relative to the building.

17. Apparatus according to claim 8, wherein the high frequency signal produced by the high frequency producing circuit is in the range 5 MHz to 15 MHz.

* * * * *